United States Patent
Hsu

(10) Patent No.: US 6,806,554 B2
(45) Date of Patent: Oct. 19, 2004

(54) SELF-ALIGNED SIGE HBT ON A SOI SUBSTRATE

(75) Inventor: Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/413,257

(22) Filed: Apr. 14, 2003

(65) Prior Publication Data

US 2003/0207512 A1 Nov. 6, 2003

Related U.S. Application Data

(62) Division of application No. 09/820,419, filed on Mar. 29, 2001, now Pat. No. 6,548,364.

(51) Int. Cl.[7] .................... H01L 27/082; H01L 27/102; H01L 29/70; H01L 31/11

(52) U.S. Cl. ........................................ 257/565; 257/592

(58) Field of Search ................................. 257/565, 567, 257/576, 578, 591, 592

(56) References Cited

U.S. PATENT DOCUMENTS 5,382,815 A * 1/1995 Mohammad et al. ........ 257/197

* cited by examiner

*Primary Examiner*—Phuc T. Dang
(74) *Attorney, Agent, or Firm*—David C. Ripma; Matthew D. Rabdau; Joseph Curtin

(57) ABSTRACT

A SiGe HBT BiCMOS on a SOI substrate includes a self-aligned base/emitter junction to optimize the speed of the HBT device. The disclosed SiGe BiCMOS/SOI device has a higher performance than a SiGe BiCMOS device on a bulk substrate. The disclosed device and method of fabricating the same also retains the high performance of a SiGe HBT and the low power, high-speed properties of a SOI CMOS. In addition, the disclosed method of fabricating a self-aligned base/emitter junction provides a HBT transistor having an improved frequency response.

9 Claims, 9 Drawing Sheets

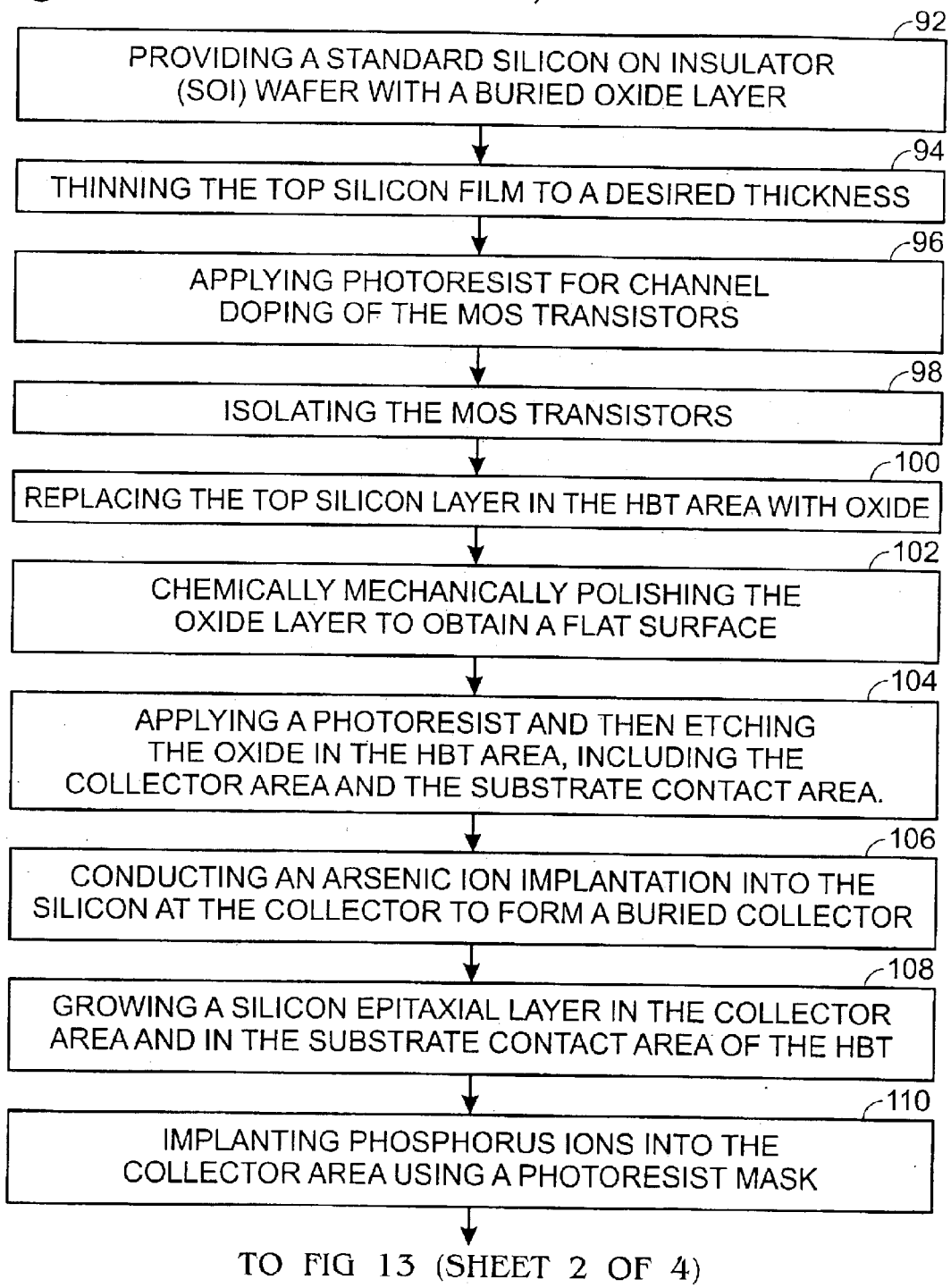
Fig. 13 (SHEET 1 OF 4)

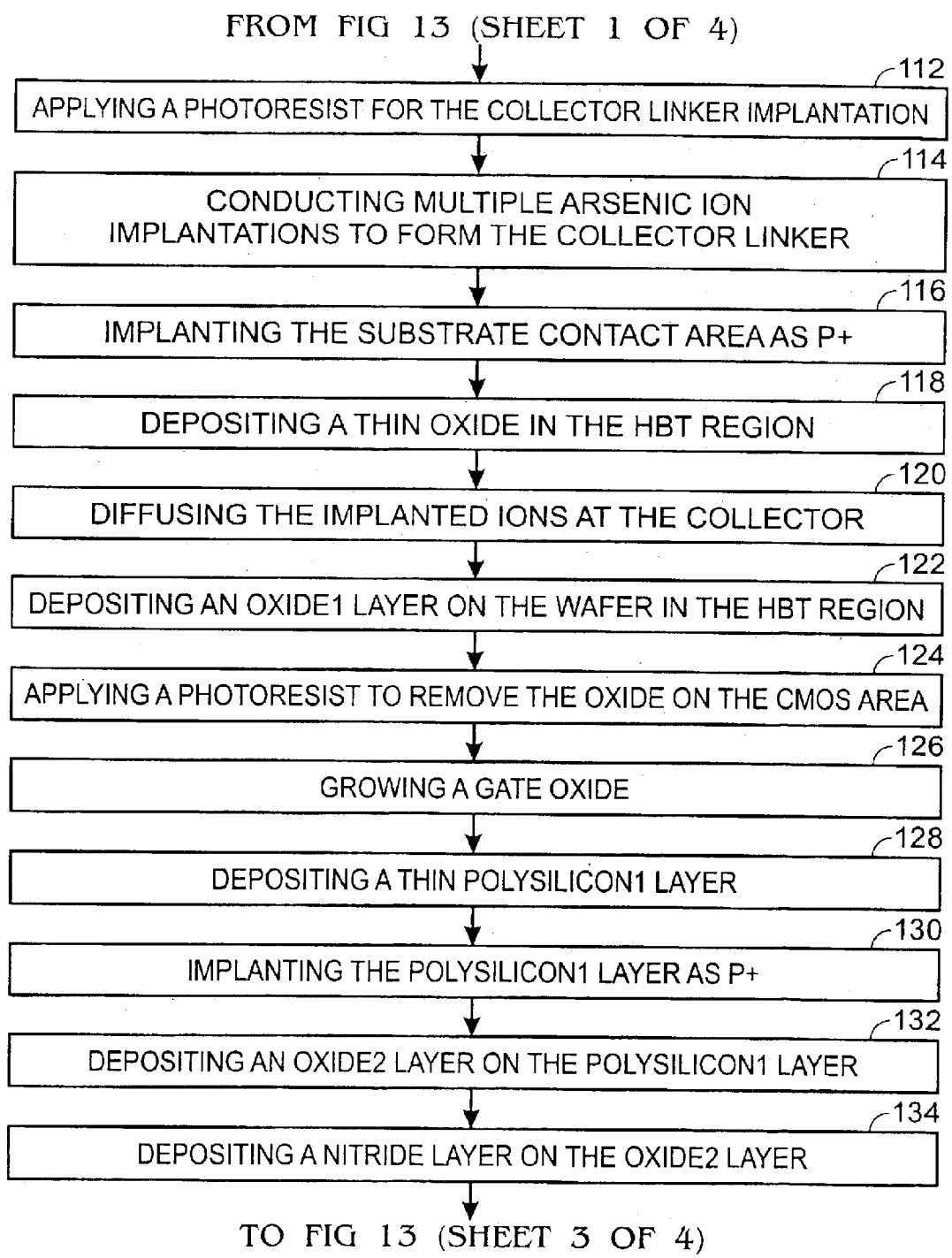
Fig. 13 (SHEET 2 OF 4)

Fig. 13 (SHEET 3 OF 4)
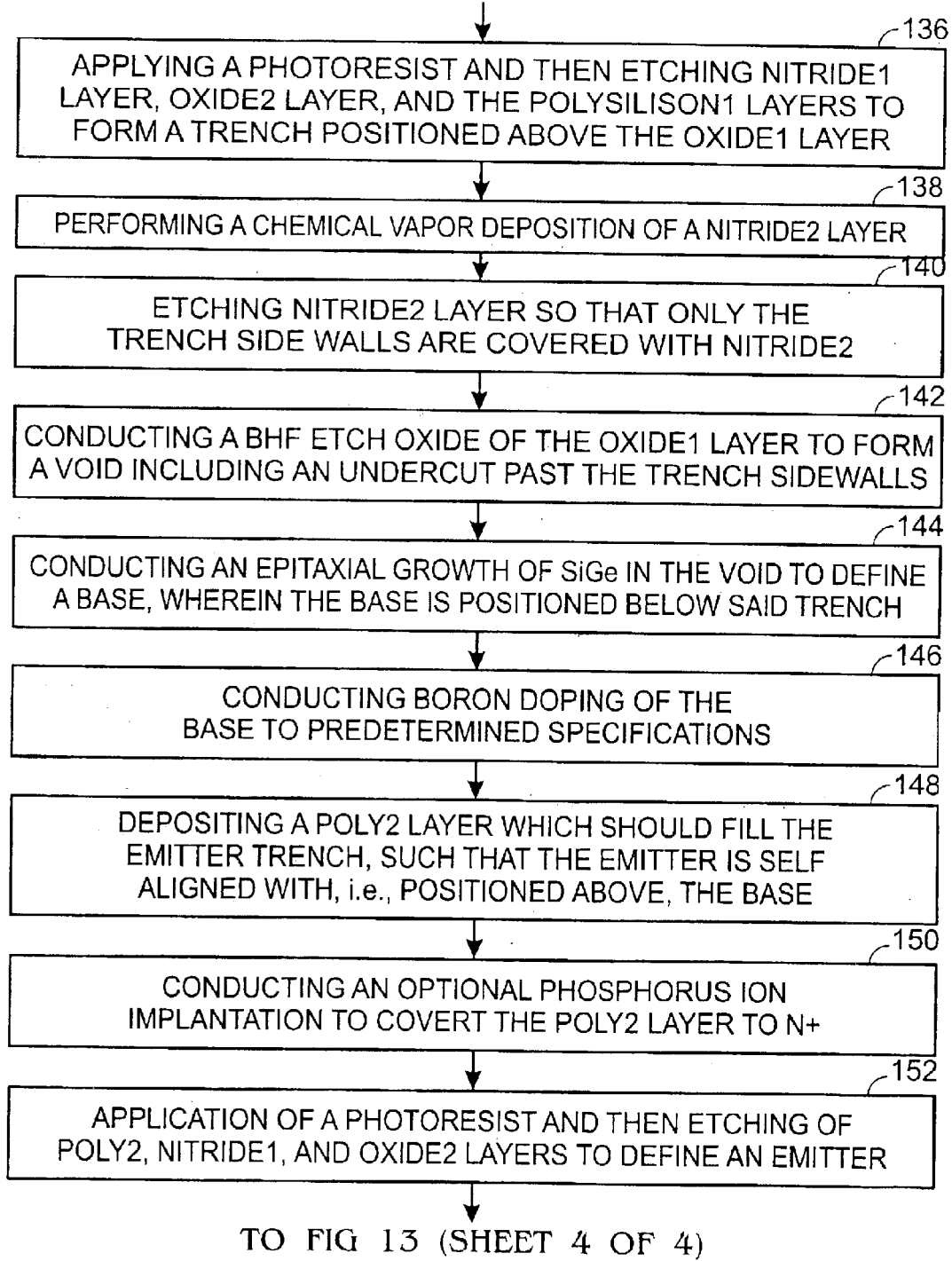

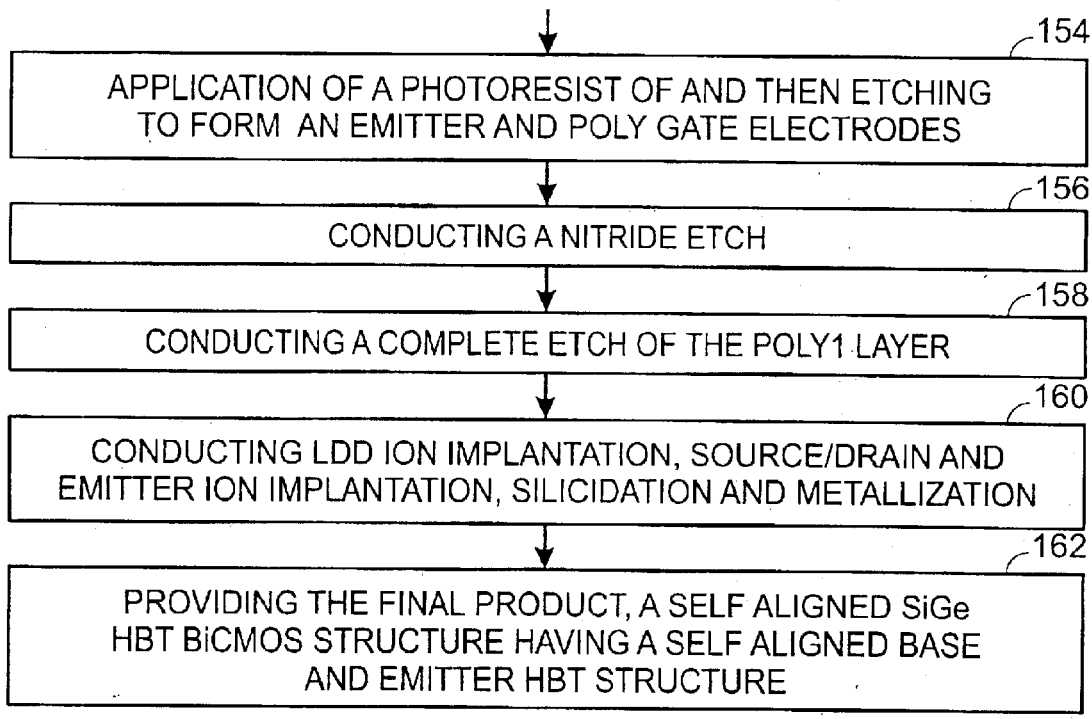
Fig. 13 (SHEET 4 OF 4)

SELF-ALIGNED SIGE HBT ON A SOI SUBSTRATE

CROSS REFERENCE TO RELATED APPLICATION

This application is a divisional of application Ser. No. 09/820,419, filed Mar. 29, 2001 now U.S. Pat. No. 6,548,364, entitled "Self-Aligned SiGe HBT BiCMOS on SOI Substrate and Method of Fabricating the Same," invented by Sheng Teng Hsu, now U.S. Pat. No. 6,548,364.

FIELD OF THE INVENTION

This invention relates to a CMOS integrated circuit and, more particularly, to a self-aligned SiGe HBT BiCMOS on a SOI substrate, and a method of fabricating the same.

BACKGROUND OF THE INVENTION

Conventional fabrication steps for manufacturing Silicon Germanium (SiGe) bipolar complementary metal oxide semiconductor (BiCMOS) devices include fabricating complementary metal oxide semiconductors (CMOS) and SiGe bipolar hetero-junction bipolar transistors (HBT) on a bulk silicon substrate. This process produces a very high performance HBT for analogue signal processing wherein the CMOS portion is used for digital signal processing and data storage. A problem with this state-of-the-art structure is that the bulk CMOS is relatively slow and consumes a relatively large amount of power. The fabrication process for the device is also complex.

By integrating SiGe HBT into silicon-on-insulator (SOI) substrates one can retain the performance of the SiGe HBT and the low power, high-speed properties of a SOI CMOS. Such devices, and processes of manufacturing the same, have been disclosed in U.S. patent application Ser. No. 09/649,380, filed on Aug. 28, 2000 and titled "Method of Fabricating High Performance SiGe HBT BiCMOS on SOI Substrate," wherein the entire disclosure of said patent application is hereby incorporated by reference. In this patent application, however, the disclosed base/collector junction is not self-aligned. Accordingly, the speed of the device disclosed in the patent application is relatively slow.

SUMMARY OF THE INVENTION

The present invention provides a SiGe HBT BiCMOS on a SOI substrate, and a method of fabricating the same, including a self-aligned base/collector junction to optimize the speed of the HBT. The disclosed SiGe BiCMOS/SOI device has a higher performance than a SiGe BiCMOS device on a bulk Silicon substrate. The disclosed device, and method of fabricating the same, also retains the high performance of a SiGe HBT and the low power, high-speed properties of a SOI CMOS. In addition, the disclosed method of fabricating a self-aligned base/collector junction provides a HBT transistor having an improved frequency response.

Accordingly, an object of the invention is to provide a SiGe HBT BiCMOS on a SOI substrate that retains the high performance of a SiGe HBT and the low power, high-speed properties of a SOI CMOS.

Another object of the invention is to provide a SiGe HBT BiCMOS on a SOI substrate including a self-aligned base/collector junction.

A further object of the invention is to provide a SiGe HBT BiCMOS on a SOI substrate having an improved frequency response.

BRIEF DESCRIPTION OF THE DRAWINGS

FIG. 13 is a flowchart of the process of the present invention.

DETAILED DESCRIPTION OF THE PREFERRED EMBODIMENTS

The structure of the proposed self-aligned SiGe BiCMOS/SOI is similar to the device disclosed in each of the above listed patent applications. However, there are several major differences. In particular, the base/collector of the present device is self-aligned. By "self-aligned" Applicant means that the emitter is built up directly on the base. This self-aligned structure provides for a device having a relatively fast operating speed and an improved frequency response. The structure of the gate electrode as well as the structure of the base and the emitter are also different from the device as disclosed in the above listed patent applications. The structure of the present invention will become obvious after review of the following description taken in conjunction with the enclosed figures.

Figure 1:
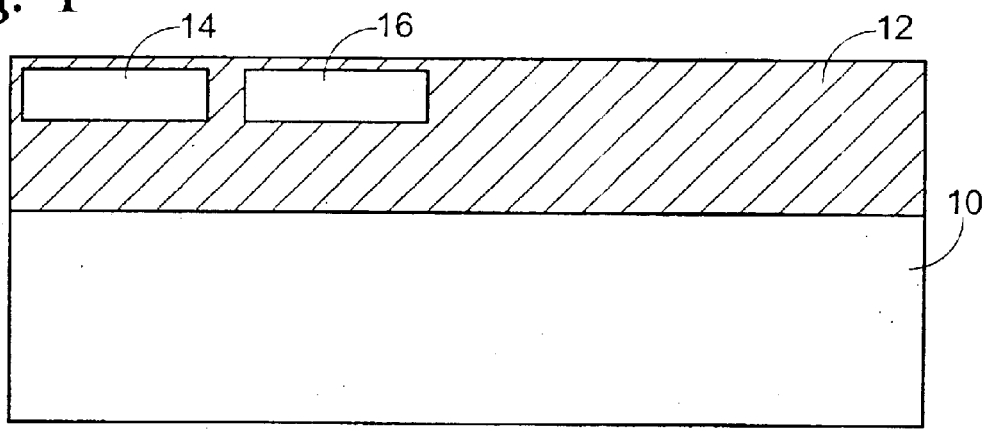
FIGS. 1–12 are schematic drawings showing build-up of the device during the fabrication process.

Referring to FIG. 1, the fabrication process is now described. The starting material is a standard silicon on insulator (SOI) wafer 10 with a buried oxide 12 having a thickness of 400 to 500 nm. This is the standard buried oxide thickness of SIMOX (Separation by Implantation of Oxygen) wafers. The next step comprises thinning the top silicon film by a thermal oxidation process to achieve a desired thickness. For a 0.25 $\mu$m channel length process, the thickness of the top silicon film should be about 30 nm for a fully depleted SOI (FDSOI) wafer. For a partially depleted SOI wafer, the top silicon thickness for a 0.25 $\mu$m CMOS device should be about 50 nm to 100 nm. Photoresist is then applied for channel doping of the MOS transistors by ion implantation.

Still referring to FIG. 1, a local oxidation of Silicon (LOCOS) process or shallow trench isolation (STI) process is used to isolate the active MOS transistors 14 and 16. During this process step the top silicon layer in the HBT areas is also replaced with oxide. The STI process preferably is used to form the isolation. The process involves a photoresist and an etch of the top silicon layer from the isolation and HBT areas. The etch damage is cleaned and a layer of oxide is deposited onto the wafer. The oxide is chemical-mechanically polished (CMP) to obtain a flat surface. For fabrication of bulk BiCMOS devices the n-well and the p-well must be formed prior to the STI process. Moreover, the depth of the STI for bulk BiCMOS devices must be no deeper than 500 nm.

Figure 2:
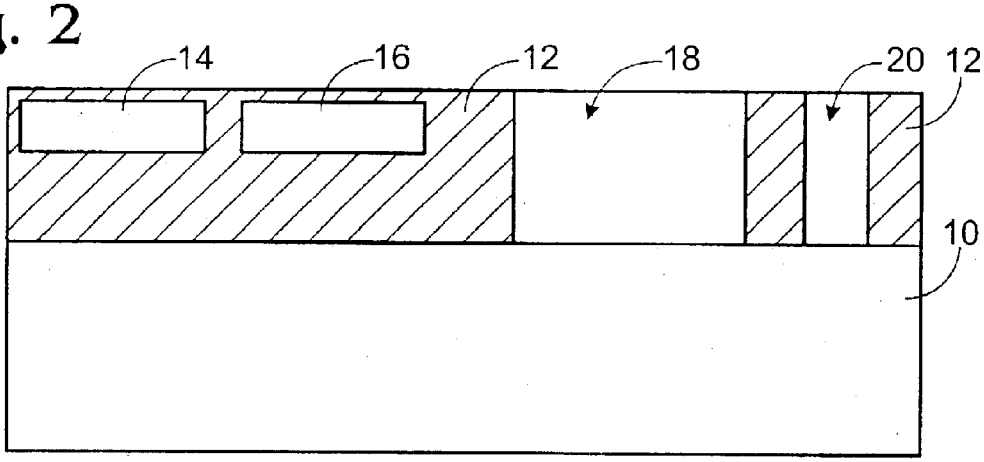

FIG. 2 shows the results of a photoresist applied to etch the oxide in the HBT areas, including collector area 18 and substrate contact area 20.

Figure 3:
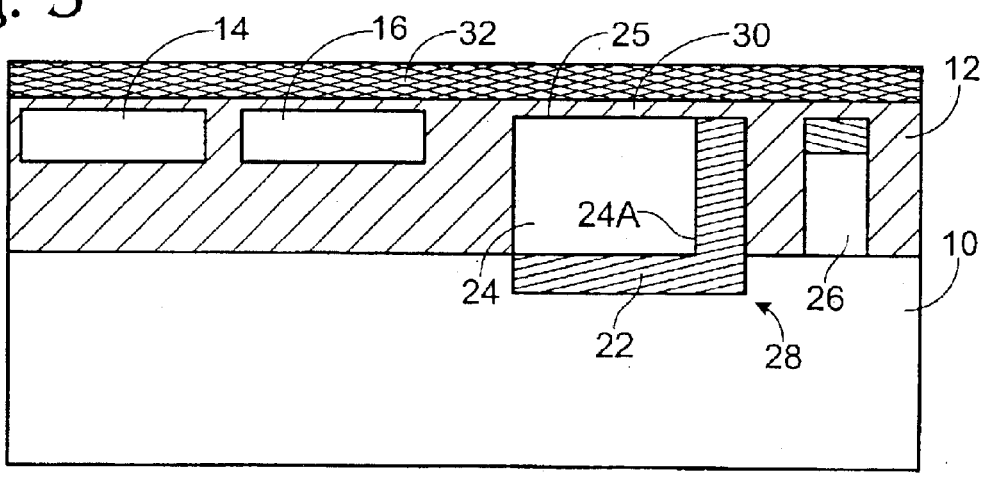

FIG. 3 shows Arsenic ion implantation into the silicon at the collector 18 to form the buried collector 22. The ion dose is in the range of $1\times10^{14}$ to $1\times10^{15}/cm^2$. A Silicon epitaxial layer is selectively grown on the collector area 24 and the substrate contact area 26 of the HBT 28. The thickness of the silicon epitaxial layer typically is 400 nm to 450 nm, which is enough to completely fill the HBT trenches 18 and 20 (FIG. 2). The collector epitaxial area 24 may be grown with in-situ doping. The doping density of this layer will typically be in a range of $1\times10^{16}$ to $5\times10^{17}$. In such a case, a separate boron ion implantation to the substrate contact area 26 is required. Phosphorus ions are implanted into the collector area 24 by using a photoresist mask process. The energy of the implantation is in a range of 15 to 25 keV and the dose is in a range of $1 \times 10^{12}$ to $5 \times 10^{13}/cm^2$. The photoresist is removed and a new photoresist is applied for the collector linker ion implantation. Multiple arsenic ion implantations are used to form the collector linker 24A. The energies of the implantations are 40 keV to 100 keV and 300 keV to 450 keV, respectively. The doses for both deep and shallow arsenic ion implantation are on the order of $1 \times 10^{14}$ to $1 \times 10^{15}/cm^2$. Photoresist is also applied to implant the substrate contact area 26 as P+. A thin oxide layer 25 (only shown in this particular figure for ease of illustration) of 20 nm to 100 nm is deposited and the implanted ions at the collector 24 are diffused at a high temperature, such as in a range of 900° C. to 1100° C., for 30 to 100 minutes. An oxide layer 30, having a thickness in a range of 300 nm to 600 nm, referred to as Oxide 1, is deposited onto the surface of the SOI wafer in the region of the HBT, i.e., over thin layer 25. Photoresist is applied to remove the oxide on the CMOS areas 14 and 16. A gate oxide is grown and a thin polysilicon layer 32, referred to as poly1, is deposited. The thickness of poly1 layer 32 is in a range of 200 nm to 500 nm.

Figure 4:
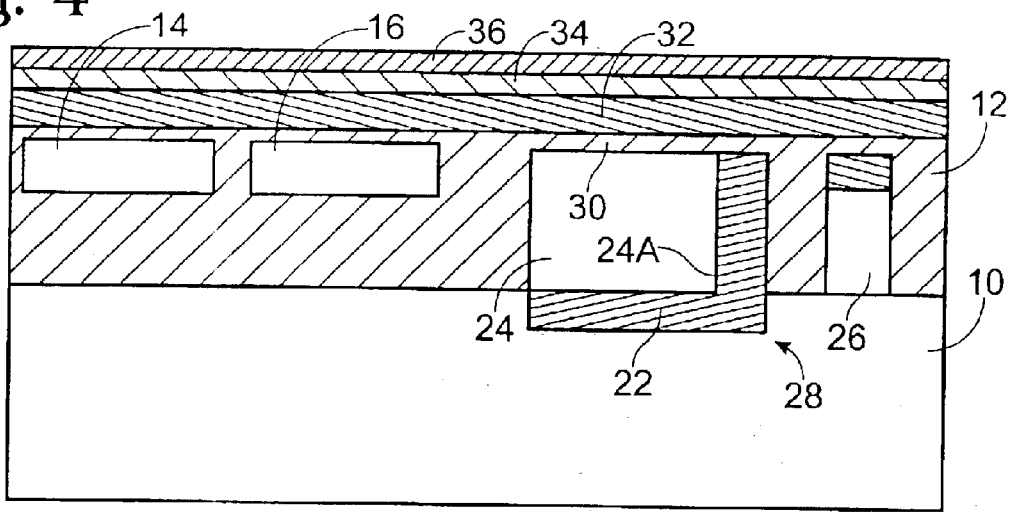

FIG. 4 shows the results of implantation of poly1 layer 32 as P+. The next step of the process comprises depositing an oxide layer 34, referred to as oxide2, having a thickness in a range of 200 nm to 500 nm, on poly1 layer 32. A nitride layer 36, referred to as Nitride1, having a thickness in a range of 20 nm to 50 nm, is then deposited on oxide layer 34.

Figure 5:
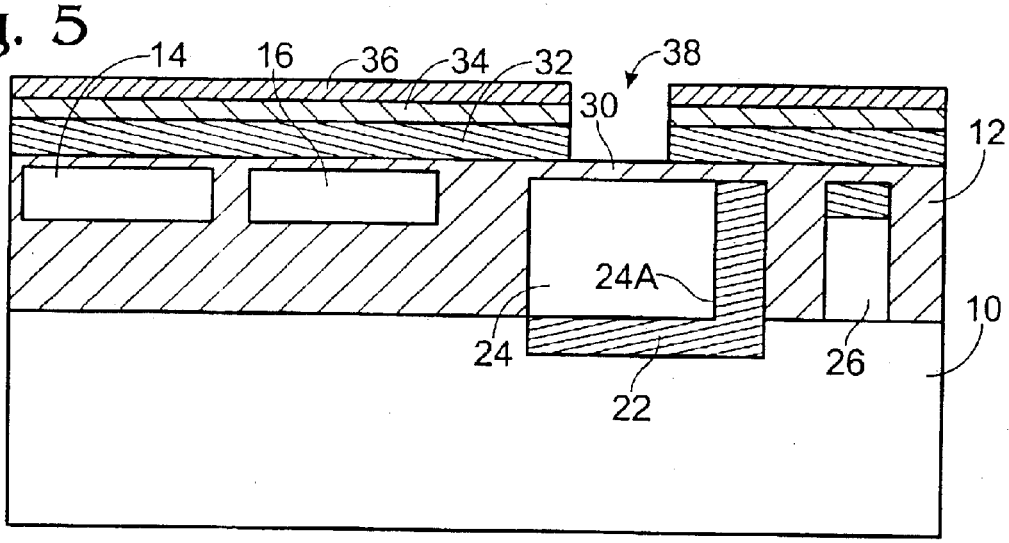

FIG. 5 shows the steps of photoresist and etch of Nitride1 layer 36, Oxide2 layer 34, and Poly1 layer 32. The etch is stopped at oxide1 layer 30 and forms a trench 38.

Figure 6:
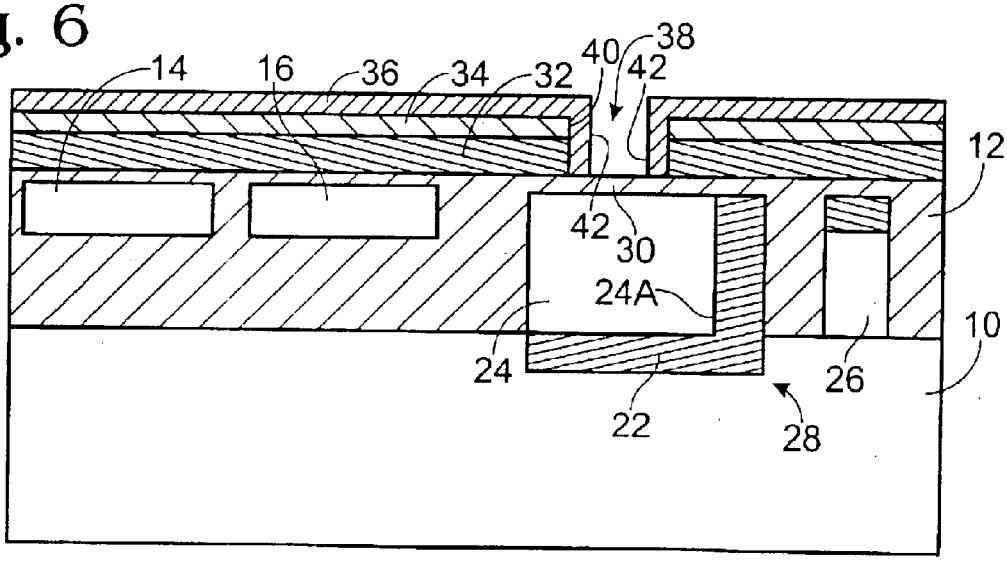

FIG. 6 shows the results of a chemical vapor deposition (CVD) of a Nitride2 layer 40. The thickness of Nitride2 layer 40 is in the range of 10 nm to 50 nm. Nitride2 layer 40 is then plasma etched and stops at nitride1 layer 36 and at oxide1 layer 30. This will remove all Nitride2 from the wafer except on the side wall 42 of trench 38 at the emitter opening. The surface of the SOI wafer is still covered by Nitride1 layer 36.

Figure 7:
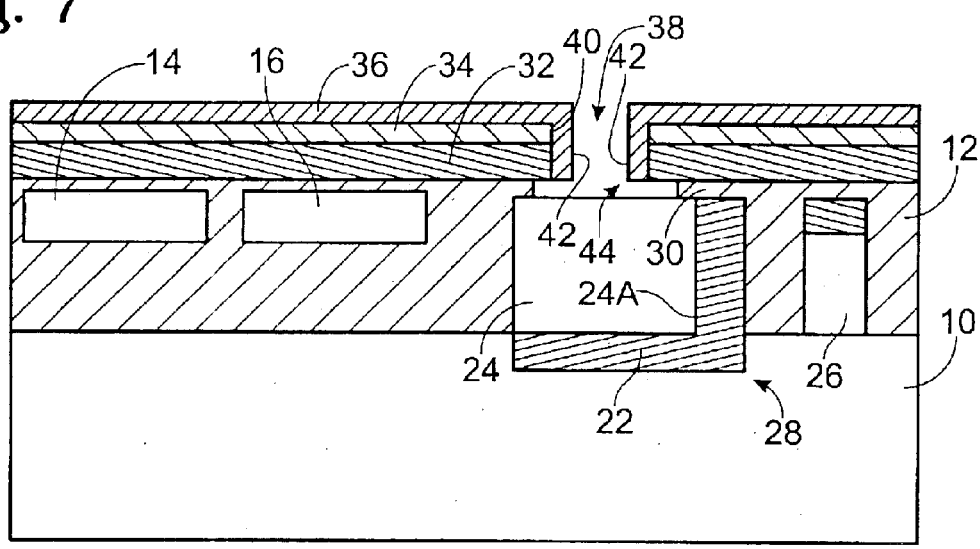

FIG. 7 shows the BHF etch oxide step of Oxide1 layer 30. Oxide1 layer 30 is over etched to undercut past the side walls 42 of trench 38 to form a void 44, i.e., the width of void 44 is greater than the width of trench 38. The over etching of Oxide1 layer 30 is controlled by the etch rate and etch time, which will vary for each particular application. In one particular application, the etch rate and time are about 30 nm/min for about 3 minutes.

Figure 8:
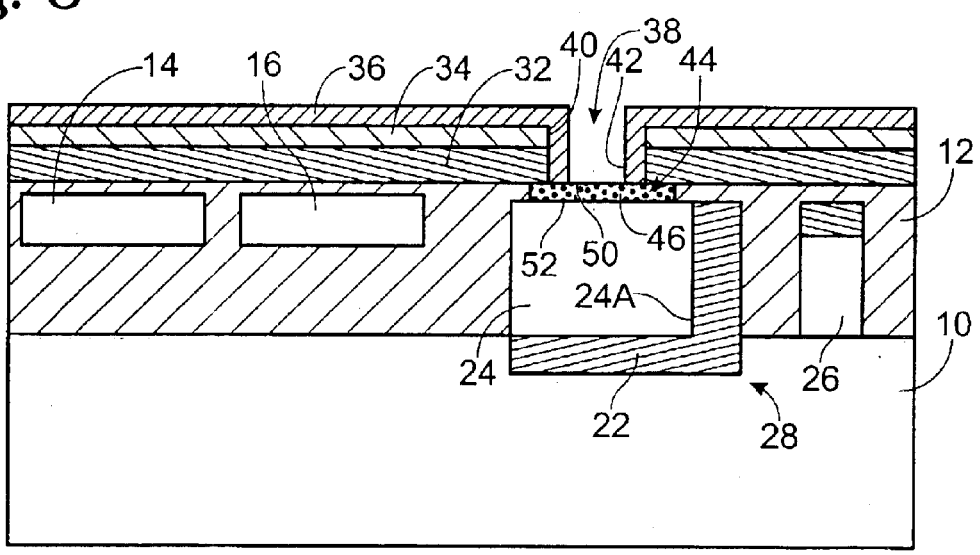

FIG. 8 shows the selective epitaxial growth of silicon germanium (SiGe) layer 46. Boron ion implantation is then used to dope the base region 46. SiGe layer 46 fills the undercut region 44 created in the previous process step. The germanium and the base boron concentration are controlled for the proper base design, which will vary for particular applications. The germanium concentration typically is in a range of 3% to 5%, and is approximately 4% at the emitter-to-base interface 50, and increases to a range of 25% to 45%, and is about 40% at the base-to-collector interface 52. The boron density is generally in a range of $1.0 \times 10^{18}/cm^3$ to $1.0 \times 10^{19}/cm^3$, and typically is about $5.0 \times 10^{18}/cm^3$, at the emitter-to-base interface 50, and generally is below $1.0 \times 10^{16}/cm^3$ at the base-to-collector interface 52. Both the germanium and the boron can be in-situ doped.

Figure 9:
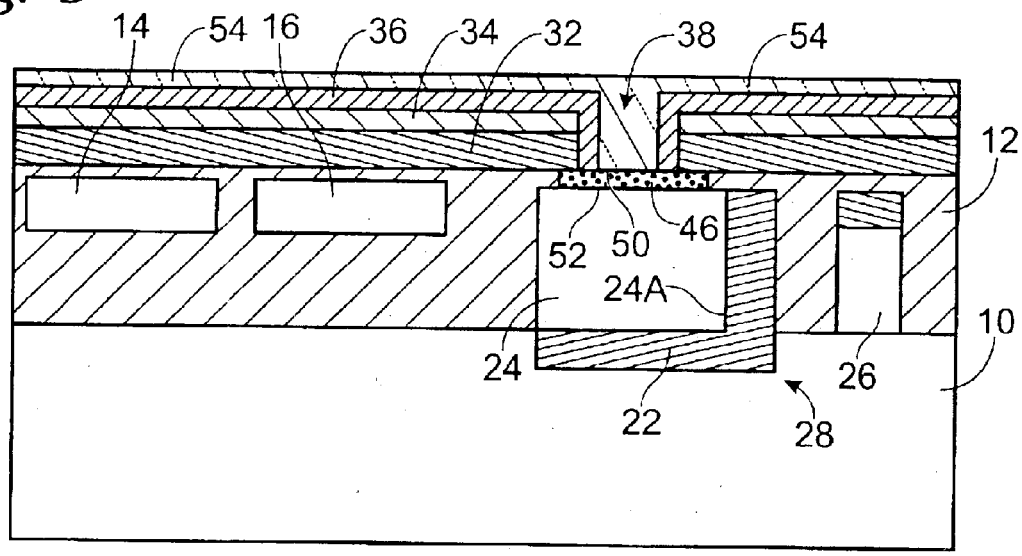

FIG. 9 shows the deposition of poly2 layer 54. The thickness of poly2 layer 54 preferably should fill up emitter opening 38. The thickness of poly2 layer 54 preferably is thicker than one half of the width of emitter 38. An optional process step comprises a phosphorus ion implantation to convert poly2 layer 54 to N+.

Figure 10:
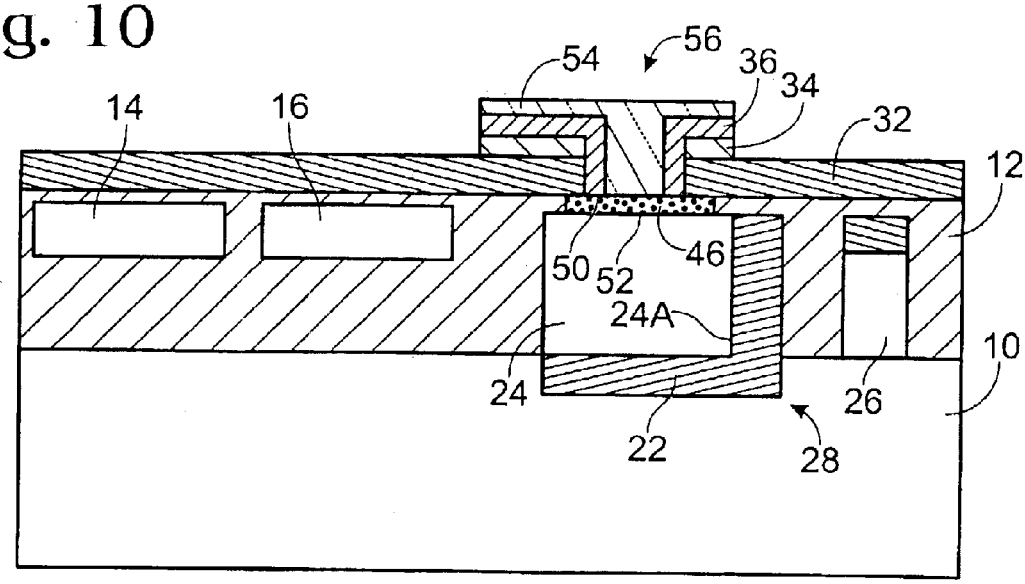

FIG. 10 shows the results of a photoresist applied to protect the emitter area 56 from plasma etching of poly2 layer 54, nitride1 layer 36, and oxide2 layer 34. The resist is removed after etching.

Figure 11:
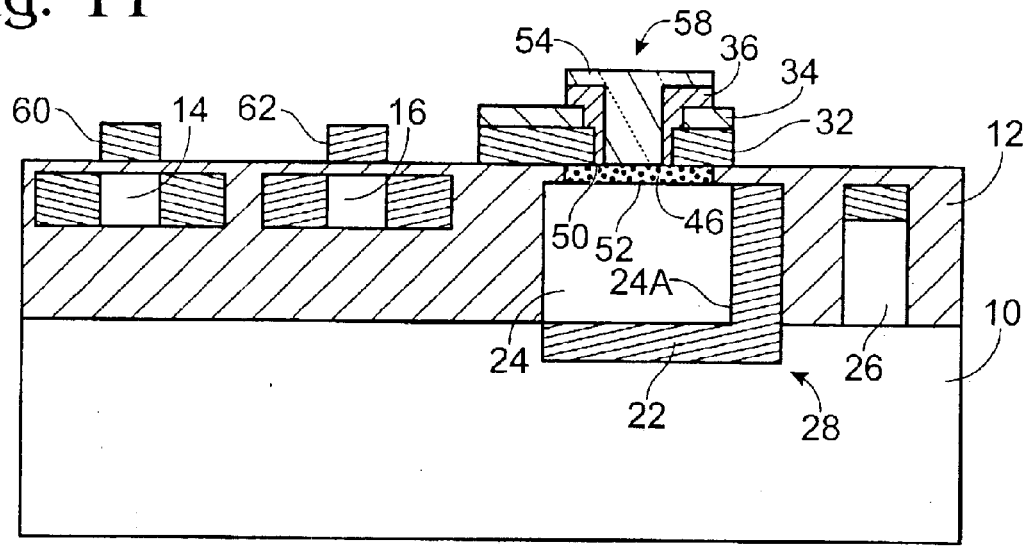

FIG. 11 shows the results of a photoresist applied to protect against the etch of poly2 emitter 58 and poly1 gate electrodes 60 and 62. An option of removing nitride from outside the emitter region can be accomplished by stopping the poly etch at the end point of the poly2 etch. This means that all of the poly2 layer has been etched and is stopped at nitride layer 36. This step is then followed by a nitride etch. The nitride etch is followed by the completion of etching poly1 layer 32. The resist is then stripped from MOS regions 60 and 62.

Figure 12:
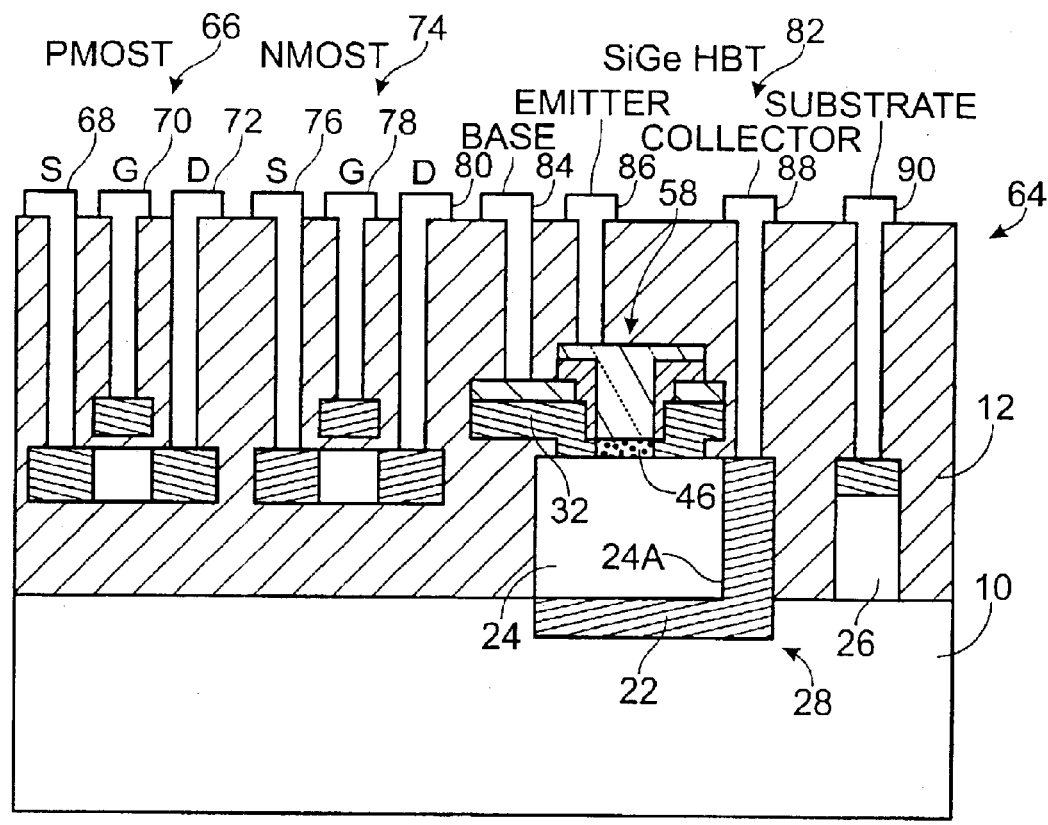

FIG. 12 shows the results of the remaining process steps including lightly doped drain (LDD) ion implantation, source/drain and emitter ion implantation, silicidation and metallization, which can each be accomplished using any state-of-the-art process. FIG. 12 shows the final structure 64 resulting from the process of the present invention. Device 64 includes PMOST 66 including a source 68, a gate 70 and a drain 72. NMOST 74 includes a source 76, a gate 78 and a drain 80. SiGe HBT 82 includes a base 84, an emitter 86, a collector 88 and a substrate contact 90. The emitter 58 of HBT 82 is self aligned with, i.e., built up during manufacturing so as to be positioned aligned with, its base 46. Intrinsic base 46 is connected to poly1 layer 32, which is connected to interconnect contact, i.e., extrinsic base, 84. Emitter 86 defines an interconnect contact which is in contact with polysilicon2 layer 54 in trench 38. The electrodes each comprise a polysilicon gate region positioned above respective MOS regions 14 and 16, with a layer of oxide positioned therebetween. The extrinsic base typically is manufactured of polysilicon.

FIG. 13 shows a flowchart of the process of the present invention. Step 92 comprises providing a standard silicon on insulator (SOI) wafer with a buried oxide layer. Step 94 comprises thinning the top silicon film to a desired thickness. Step 96 comprises applying a photoresist for channel doping of the MOS transistors. Step 98 comprises isolating the MOS transistors. Step 100 comprises replacing the top silicon layer in the HBT area with an oxide. Step 102 comprises chemically mechanically polishing the oxide layer to obtain a flat surface. Step 104 comprises applying a photoresist and then etching the oxide in the HBT areas, including the collector area and the substrate contact area. Step 106 comprises conducting an arsenic ion implantation into the silicon at the collector to form a buried collector. Step 108 comprises growing a silicon epitaxial layer in the collector area and in the substrate contact area of the HBT. Step 110 comprises implanting phosphorus ions into the collector area using a photoresist mask. Step 112 comprises applying a photoresist for the collector linker implantation. Step 114 comprises conducting multiple arsenic ion implantations to form the collector linker. Step 116 comprises implanting the substrate contact area as P+. Step 118 comprises depositing a thin oxide in the HBT region. Step 120 comprises diffusing the implanted ions at the collector. Step 122 comprises depositing an oxide layer on the wafer in the HBT region. Step 124 comprises applying a photoresist to remove the oxide on the CMOS areas. Step 126 comprises growing a gate oxide. Step 128 comprises depositing a thin polysilicon1 layer. Step 130 comprises implanting the poly1 layer as P+. Step 132 comprises depositing an oxide2 layer on the polysilicon1 layer. Step 134 comprises depositing a nitride layer on the oxide2 layer. Step 136 comprises applying a photoresist and then etching nitride1 layer, oxide2 layer, and the poly1 layer to form a trench positioned above the oxide1 layer. Step 138 comprises performing a chemical vapor deposition of a nitride2 layer. Step 140 comprises etching nitride2 layer so that only the trench side walls are covered with nitride2. Step 142 comprises a BHF etch oxide of the oxide1 layer to form a void including an undercut past the trench sidewalls. Step 144 comprises an epitaxial growth of SiGe in the void to define a base. Step 146 comprises boron doping of the base. Step 148 comprises depositing a poly2 layer which should fill the emitter trench. Step 150 comprises conducting an optional phosphorus ion implantation to covert the poly2 layer to N+. Step 152 comprises application of a photoresist and then etching of poly2, nitride1 and oxide2 layers to define an emitter. Step 154 comprises application of a photoresist and then etching to form an emitter and poly gate electrodes. Step 156 comprises a nitride etch. Step 158 comprises complete etching of the poly1 layer. Step 160 comprises LDD ion implantation, source/drain and emitter ion implantation, silicidation and metallization. This process results in 162, providing a self-aligned SiGe HBT BiCMOS structure having a self aligned base and emitter HBT structure.

Thus, a self-aligned SiGe HBT BiCMOS on a SOI substrate, and a method of fabricating the same, has been disclosed. Although preferred structures and methods of fabricating the device have been disclosed, it should be appreciated that further variations and modifications may be made thereto without departing from the scope of the invention as defined in the appended claims.

I claim:

1. A self-aligned SiGe HBT on a SOI substrate comprising:

a silicon on insulator substrate;

a base positioned on said silicon on insulator substrate, said base including an extrinsic base connected to a first polysilicon layer, and said first polysilicon layer being connected to an intrinsic base wherein said intrinsic base is manufactured by depositing a SiGe layer in a void positioned below a trench which is adapted to receive a second polysilicon layer therein so as to define an emitter; and an emitter positioned on said silicon on insulator substrate, said emitter positioned above and in contact with said intrinsic base.

2. The SiGe HBT of claim 1 wherein said extrinsic base is positioned adjacent said emitter.

3. The SiGe HBT of claim 1 wherein said intrinsic base is positioned above and in contact with a collector region.

4. The SiGe HBT of claim 1 wherein said trench includes a sidewall having a nitride layer positioned thereon.

5. The SiGe HBT of claim 1 further comprising a CMOS including a NMOST and a PMOST.

6. The SiGe HBT of claim 1 wherein the intrinsic base defines an emitter-to-base interface and a base-to-collector interface, wherein the intrinsic base has a germanium concentration in a range of 3% to 5% adjacent said emitter-to-base interface and a germanium concentration in a range of 25% to 45% adjacent said base-to-collector interface.

7. The SiGe HBT of claim 1 wherein the intrinsic base defines an emitter-to-base interface and a base-to-collector interface, wherein the intrinsic base has a boron density in a range of $1.0 \times 10^{18}/cm^3$ to $1.0 \times 10^{19}/cm^3$ adjacent said emitter-to-base interface and a boron density less than $10 \times 1.0^{19}/cm^3$ adjacent said base-to-collector interface.

8. The SiGe HBT of claim 1 wherein said substrate includes a buried oxide layer and wherein said extrinsic base is manufactured of polysilicon.

9. The SiGe HBT of claim 1 wherein said intrinsic base is positioned above and in contact with an epitaxial layer of a collector region.

* * * * *